(12) United States Patent
Furlong et al.

(10) Patent No.: US 10,338,642 B2
(45) Date of Patent: Jul. 2, 2019

(54) HALL SWITCH WITH ADAPTIVE THRESHOLD

(71) Applicant: Honeywell International Inc., Morris Plains, NJ (US)

(72) Inventors: Gregory Furlong, Chicago, IL (US); Lamar Floyd Ricks, Lewis Center, OH (US); Jason Chilcote, Frisco, TX (US)

(73) Assignee: Honeywell International Inc., Morris Plains, NJ (US)

( * ) Notice: Subject to any disclaimer, the term of this patent is extended or adjusted under 35 U.S.C. 154(b) by 64 days.

(21) Appl. No.: 15/160,473

(22) Filed: May 20, 2016

(65) Prior Publication Data

US 2017/0336832 A1    Nov. 23, 2017

(51) Int. Cl.
    *G06F 1/16*     (2006.01)
    *G01D 5/14*     (2006.01)
    *G01R 33/07*     (2006.01)

(52) U.S. Cl.
    CPC ........... *G06F 1/1677* (2013.01); *G01D 5/145* (2013.01); *G01R 33/07* (2013.01); *G01R 33/072* (2013.01)

(58) Field of Classification Search
    CPC .... G01R 15/20; G01R 15/202; G01R 15/207; G01R 33/06; G01R 33/072; G01D 5/145; G01D 5/142; G01D 5/2448; G06F 1/1677; H03K 19/0021; H03K 2217/94026
See application file for complete search history.

(56) References Cited

U.S. PATENT DOCUMENTS

| | | |
|---|---|---|
| 4,914,387 A | 4/1990 | Santos |
| 5,650,719 A | 7/1997 | Moody et al. |
| (Continued) | | |

FOREIGN PATENT DOCUMENTS

| | | |
|---|---|---|
| CN | 107404313 A | 11/2017 |
| EP | 1850143 A1 | 10/2007 |
| (Continued) | | |

OTHER PUBLICATIONS

Europe Patent Application No. 17171178.1, Extended European Search Report, dated Oct. 24, 2017, 8 pages.

*Primary Examiner* — Huy Q Phan
*Assistant Examiner* — Dustin R Dickinson
(74) *Attorney, Agent, or Firm* — Craige Thompson; Thompson Patent Law; Vincent Musgrove

(57) ABSTRACT

An electronic device incorporating a magnet and a Hall-effect sensor to determine a location of a portion of the electronic device. The electronic device comprises a magnet mechanically coupled to a first portion of the electronic device and a Hall-effect sensor coupled to a second portion of the electronic device where the first portion and the second portion are moveable with reference to each other and where the Hall-effect sensor receives a magnetic field of the magnet. The device further comprises an electronic stage that outputs a comparison threshold signal based on peak detecting an output of the Hall-effect sensor using a long term adjustment and resetting the long term adjustment to a current output of the Hall-effect sensor in response to a short term adjustment and a switch electronic stage that switches in response to the output of the Hall-effect sensor exceeding the comparison threshold output.

20 Claims, 3 Drawing Sheets

(56) References Cited

U.S. PATENT DOCUMENTS

| | | | |
|---|---|---|---|
| 5,729,130 A * | 3/1998 | Moody | G01D 5/145 |
| | | | 324/207.12 |
| 6,191,576 B1 | 2/2001 | Ricks et al. | |
| 6,211,670 B1 * | 4/2001 | DeWilde | G01P 3/4802 |
| | | | 324/166 |
| 6,727,689 B1 | 4/2004 | Furlong et al. | |
| 6,759,843 B2 | 7/2004 | Furlong | |
| 6,967,477 B1 | 11/2005 | Murdock et al. | |
| 7,199,579 B2 * | 4/2007 | Scheller | G01V 3/081 |
| | | | 324/207.26 |
| 8,089,270 B2 | 1/2012 | Scheller et al. | |
| 2004/0227407 A1 * | 11/2004 | Nagai | G06F 1/1616 |
| | | | 307/112 |
| 2007/0089311 A1 * | 4/2007 | Amundson | G01C 17/28 |
| | | | 33/355 R |
| 2009/0051174 A1 * | 2/2009 | Ho | E05C 1/10 |
| | | | 292/251.5 |
| 2010/0207621 A1 | 8/2010 | Yano | |
| 2013/0320970 A1 * | 12/2013 | Foletto | G01D 5/2448 |
| | | | 324/251 |
| 2015/0057050 A1 | 2/2015 | Park et al. | |
| 2016/0187928 A1 * | 6/2016 | Zeng | G06F 1/1641 |
| | | | 361/679.27 |
| 2017/0082458 A1 * | 3/2017 | Zhu | G01D 5/145 |

FOREIGN PATENT DOCUMENTS

| | | | |
|---|---|---|---|
| EP | 2093583 A1 | 8/2009 | |
| EP | 3246721 A1 | 11/2017 | |
| WO | 0017901 | 3/2000 | |

* cited by examiner

HALL SWITCH WITH ADAPTIVE THRESHOLD

CROSS-REFERENCE TO RELATED APPLICATIONS

None.

STATEMENT REGARDING FEDERALLY SPONSORED RESEARCH OR DEVELOPMENT

Not applicable.

REFERENCE TO A MICROFICHE APPENDIX

Not applicable.

BACKGROUND

Position sensors are used in many items of technology. Sometimes Hall-effect sensors are used to sense a magnetic field that changes in intensity based on a relative position of the Hall-effect sensor and some other item of interest. For example, a permanent magnet may be located in an edge of a display of a laptop computer, and a Hall-effect sensor may be located in a base of the laptop such that when the display is closed, the magnet and Hall-effect sensor are close to each other. The Hall-effect sensor thus can detect when the magnet is close (when the laptop is closed) and output a corresponding signal that can be used by the laptop to trigger turning off the display and possibly triggering other power saving activities.

SUMMARY

In an embodiment, a position sensor is disclosed. The sensor comprises a Hall-effect sensor and an adaptation electronic stage coupled to the Hall-effect sensor that outputs a comparison threshold signal based on peak detecting an output of the Hall-effect sensor using a long term adjustment and resetting the long term adjustment to a current output of the Hall-effect sensor in response to a short term adjustment. The sensor further comprises a switch electronic stage coupled to the Hall-effect sensor and to the adaptation electronic stage that switches to output a logic active value in response to the output of the Hall-effect sensor exceeding the comparison threshold output.

In another embodiment, a method of determining a position of a device using a Hall-effect sensor is disclosed. The method comprises receiving a magnetic input by a Hall-effect sensor, outputting a signal by the Hall-effect sensor that represents the magnetic input, receiving the signal output by the Hall-effect sensor by an adaptation component, and storing a peak value of the received signal by the adaptation component. The method further comprises detecting a reset pattern in the received signal by the adaptation component, resetting the peak value stored by the adaptation component in response to detection of the reset pattern by the adaptation component, outputting the stored peak value by the adaptation component, and generating a threshold output that is less than but proportional to the stored peak value output by the adaptation component. The method further comprises receiving the threshold output by a switch component, receiving the signal output by the Hall-effect sensor by the switch component, and switching to output a logic active value by the switch component on the event of the received signal output by the Hall-effect sensor exceeding the received threshold output.

In yet another embodiment, an electronic device incorporating a magnet and a Hall-effect sensor to determine a location of a portion of the electronic device is disclosed. The device comprises a permanent magnet mechanically coupled to a first portion of the electronic device and a Hall-effect sensor coupled to a second portion of the electronic device where the first portion and the second portion are moveable with reference to each other and where Hall-effect sensor receives a magnetic field of the permanent magnet in at least some working configurations of the electronic device. The device further comprises an adaptation electronic stage coupled to the Hall-effect sensor that outputs a comparison threshold signal based on peak detecting an output of the Hall-effect sensor using a long term adjustment and resetting the long term adjustment to a current output of the Hall-effect sensor in response to a short term adjustment and a switch electronic stage coupled to the Hall-effect sensor and to the adaptation electronic stage that switches to output a logic active value in response to the output of the Hall-effect sensor exceeding the comparison threshold output.

These and other features will be more clearly understood from the following detailed description taken in conjunction with the accompanying drawings and claims.

BRIEF DESCRIPTION OF THE DRAWINGS

For a more complete understanding of the present disclosure, reference is now made to the following brief description, taken in connection with the accompanying drawings and detailed description, wherein like reference numerals represent like parts.

DETAILED DESCRIPTION

It should be understood at the outset that although illustrative implementations of one or more embodiments are illustrated below, the disclosed systems and methods may be implemented using any number of techniques, whether currently known or not yet in existence. The disclosure should in no way be limited to the illustrative implementations, drawings, and techniques illustrated below, but may be modified within the scope of the appended claims along with their full scope of equivalents.

The present disclosure teaches a Hall-effect position sensor that features an adaptive threshold. As a magnet approaches the Hall-effect sensor, the Hall-effect sensor output increases in amplitude. As the Hall-effect sensor exceeds a threshold, a switch that receives an output of the Hall-effect sensor transitions from a logic inactive state to a logic active state. This logic active state may be used by other processing as a signal that an object containing the magnet is close to the Hall-effect sensor. In an embodiment, the logic active signal could mean that a laptop is closed. In an embodiment, the logic active signal could mean that a battery door is closed. The threshold may be set initially for a first magnetic field strength. Later, the magnetic field strength sensed by the Hall-effect sensor may change, even when the object to which the magnet is coupled approaches just as close to the Hall-effect sensor. The location or position of the magnet may have been moved due to a collision of the system the magnet is coupled to, the magnetic field emitted by the magnet may change due to temperature changes or due to a mechanical shock the magnet may have received. As an alternative example, the magnetic field strength sensed by the Hall-effect sensor may vary across individual units of mass-produced products due to manufacturing tolerances and assembly variations and/or due to variations in the magnets provided by suppliers. The present disclosure teaches detecting the peak output of the Hall-effect sensor and adapting the threshold based on that peak to compensate for variations in the interactions between the Hall-effect sensor and the magnet. More particularly, the threshold is adapted slowly as the peak output of the Hall-effect sensor changes gradually over many cycles of position sensing and is adapted rapidly in response to the peak output of the Hall-effect sensor exhibiting a jump in value.

Figure 1:
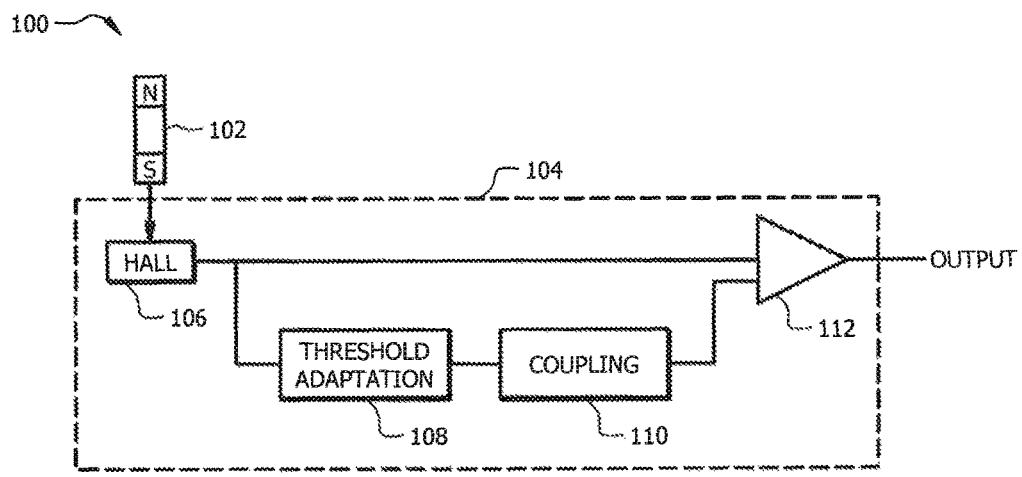
FIG. 1 is a block diagram of a system using a Hall-effect sensor detecting a position of a permanent magnet according to an embodiment of the disclosure.

Turning now to FIG. 1, a system 100 is described. In an embodiment, the system 100 comprises a magnet 102 and a position sensor 104. In embodiment, the magnet 102 may be a permanent magnet or it may be another kind of magnet such as an electromagnet stimulated by an oscillating current in a coil of wire. The position sensor 104 comprises a Hall-effect sensor 106, a threshold adaptation electronic stage 108, a coupling stage 110, and a switch stage 112. The Hall-effect sensor 106 interacts with the magnet 102 and outputs an electrical signal that is representative of or an analog of the magnetic field strength incident upon it. For example, as the magnet 102 comes close to the Hall-effect sensor 106, the magnetic field of the magnet 102 that is incident on the Hall-effect sensor 106 becomes more intense, and the amplitude of the electrical signal output by the Hall-effect sensor 106 likewise increases. The output of the Hall-effect sensor 106 is fed into the switch stage 112. The threshold adaptation 108 receives the output of the Hall-effect sensor 106 and generates a threshold signal based on that output of the Hall-effect sensor 106. The threshold signal is coupled by a coupling stage 110 to the switch stage 112. The output of the coupling stage 110 may be referred to as a coupled threshold signal or as a threshold reference signal. In an embodiment, the coupled threshold signal may be less than and proportional to the threshold signal output by the threshold adaptation electronic stage 108.

When the output of the Hall-effect sensor 106 is greater than the coupled threshold signal, the switch stage 112 outputs a logic active signal, for example a logic HI value. When the output of the Hall-effect sensor 106 drops sufficiently below the coupled threshold signal (in an embodiment, the switch stage 112 introduces a switching hysteresis), the switch stage 112 outputs a logic inactive signal, for example a logic LO value. It is understood that in a different embodiment, the polarity of active versus inactive logic may be reversed, so a logic active signal may correspond to a logic LO value and a logic inactive signal may correspond to a logic HI value.

The threshold adaptation 108 is configured to detect and hold the peak value of the output of the Hall-effect sensor 106. The threshold adaptation 108 slowly decreases its output over time to continue to track the peak value of the output of the Hall-effect sensor 106 if that peak value decreases slowly. On the other hand, the threshold adaptation 108 rapidly follows any increase in the peak value (this is what is meant by "tracking and holding" the peak). This may be referred to as long-term adjustment or long-term adaptation of the threshold adaptation stage 108. The threshold adaptation 108 is further configured to detect when the peak value of the output of the Hall-effect sensor 106 decreases significantly over a relatively short period of time, for example over two minimum-to-peak-to-minimum cycles, over five minimum-to-peak-to-minimum cycles, over eight minimum-to-peak-to-minimum cycles, or some other number of cycles. It is observed that in this example, the term "relatively short period of time" is expressed not in clock time but in terms of minimum-to-peak cycles. The criteria for what is a significant decrease in the peak may be a predefined value. As an example, a peak value that is less than about 66% of the established peak may be the criteria for significant decrease in the peak, a peak value that is less than about 50% of the established peak may be the criteria for significant decrease in the peak, a peak value that is less than about 33% of the established peak may be the criteria for significant decrease in the peak, a peak value that is less than about 25% of the established peak may be the criteria for significant decrease in the peak, or a different criteria may be predefined. When the threshold adaptation 108 detects a significant change in the peak output of the Hall-effect sensor 106 over a relatively short period of time, the threshold adaptation 108 resets its peak hold value (for example, sets the peak hold value to 0 or to a current value of the output of the Hall-effect sensor 106) and sets a new peak value based on the next peak cycle of the output of the Hall-effect sensor 106. This feature can quickly adjust to a change in the function of the position sensor 104, for example, if the magnet 102 has been moved due to damage to the system 100 or if the field strength of the magnet 102 has been altered due to a mechanical shock to the magnet 102.

Figures 2A, 2B:
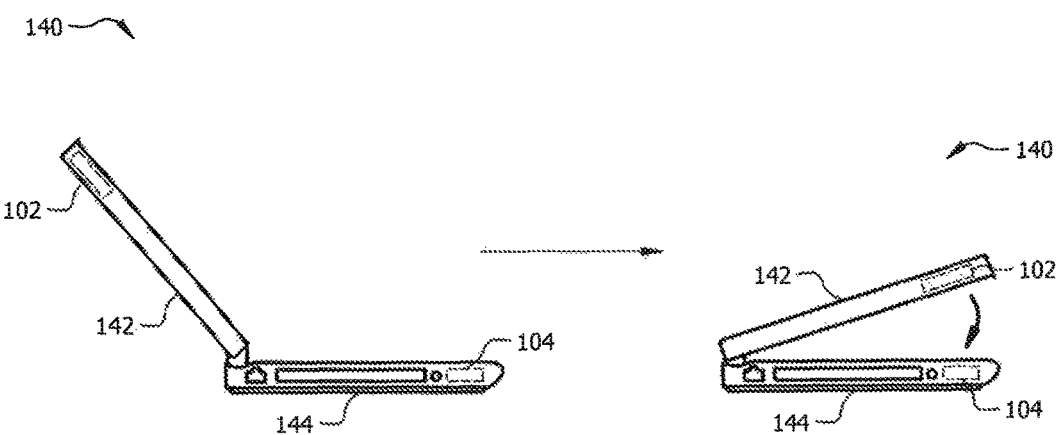
FIG. 2A is an illustration of a laptop computer with an open display.
FIG. 2B is an illustration of a laptop computer with a nearly closed display according to an embodiment of the disclosure.

Turning now to FIG. 2A and FIG. 2B, a use case for the position sensor 104 is described. A laptop computer 140 is shown having a display panel 142 and a base 144. It will be appreciated that the display panel 142 may comprise a housing or enclosure that retains a graphical display and various electronics. The display panel 142 may be coupled to the base 144 mechanically by hinges and communicatively by wires, a ribbon cable, and/or by wireless communication links. The base 144 may comprise a housing or enclosure that retains a keyboard and/or touch panel, switches, interface ports, disk drives, a battery, and a circuit board retaining various electronic components such as memory chips, microprocessor chips, digital signal processor chips, graphics processing chips, and the like. In an embodiment, the display panel 142 comprises the magnet 102, and the base 144 comprises the position sensor 104. The locations of the magnet 102 and the position sensor 104 may be such that when the display panel 142 is closed on the base 144, the magnet 102 approaches close to the position sensor 104. It is understood that in a different embodiment, the magnet 102 may be located in the base 144, and the position sensor 104 may be located in the display panel 142.

When the display panel 142 is closed on the base 144 (when the "lid" of the laptop is closed), the position sensor 104 may determine that a peak of the magnetic field emitted by the magnet 102 is sensed by the Hall-effect sensor 106 and generate a logic active output, as described above. This logic active output can be used by processing in the base 144, for example by a program being executed by a microprocessor of the base 144, to remove power from the graphics display, thereby conserving battery power. The program may take further actions in response to the transition to a logic active output of the position sensor 104.

It is understood that the position sensor 104 may be used in different use cases and in different applications. For example, the position sensor 104 and magnet 102 may be disposed on a battery cover and the base 144 of the laptop 140 such that when the battery cover is removed, the sensor 104 outputs a logic active signal (in this case the logic polarity may be reversed). This battery cover removed logic active output may be used by processing to save current state of the laptop 140 and perform a controlled shutdown in anticipation of electrical power being abruptly removed from the laptop 140. The position sensor 104 may be used in yet other use cases.

Figure 3:
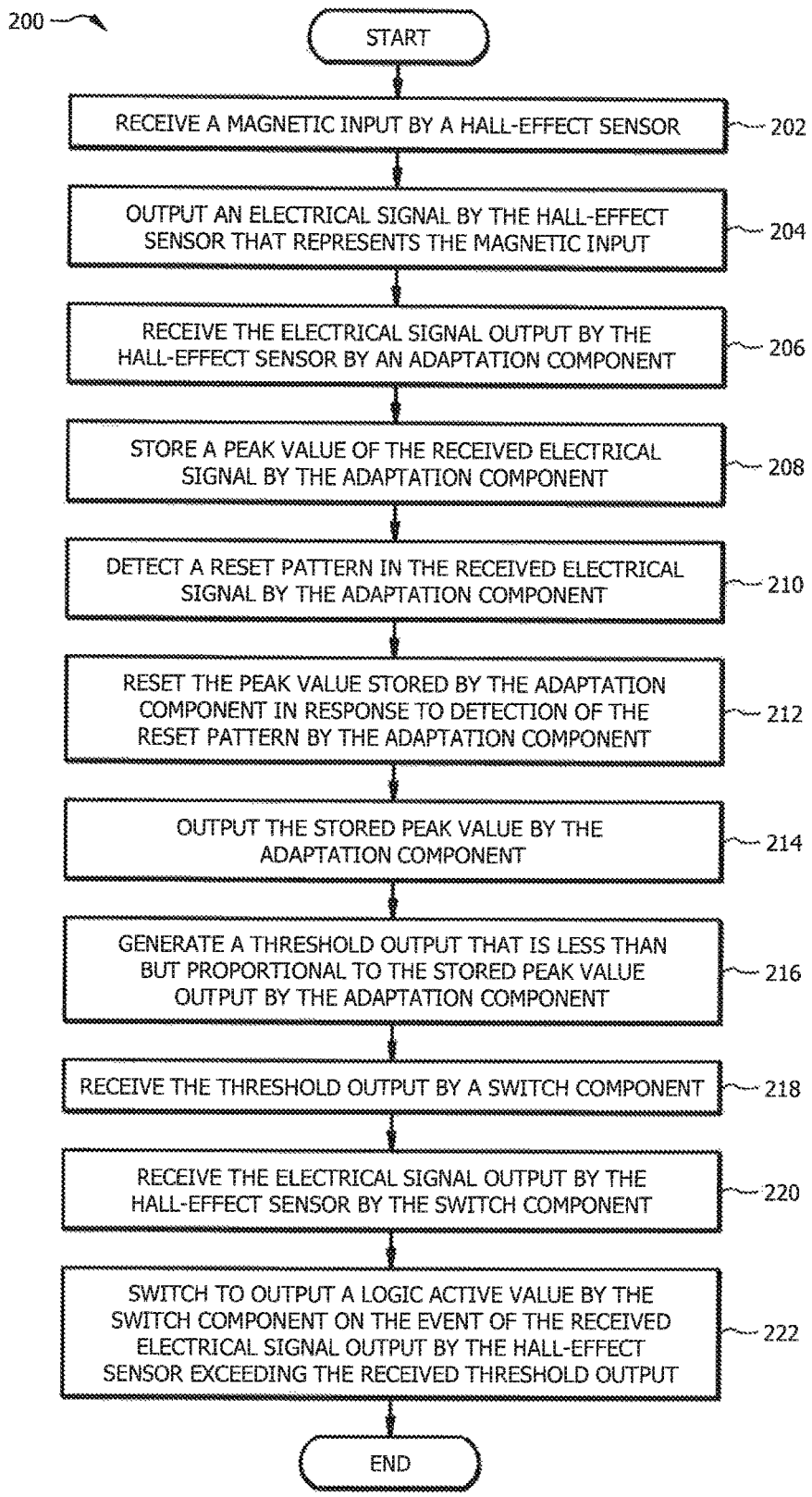
FIG. 3 is a flowchart of a method according to an embodiment of the disclosure.

Turning now to FIG. 3, a method 200 is described. At block 202, a magnetic input is received by a Hall-effect sensor. For example, the Hall-effect sensor 106 responds to a magnetic field emitted by the magnet 102. As the magnet 102 position changes (e.g., as the display panel 142 is rotated on the hinge to close the laptop 140), the magnetic field received by the Hall-effect sensor 106 changes. At block 204, a signal by the Hall-effect sensor is output that represents the magnetic input. Because the magnetic input varies with the position of the magnet 102, the output of the Hall-effect sensor 106 varies with the position of the magnet 102 and/or with the position of the display panel 142. At block 206, the signal output is received by the Hall-effect sensor by an adaptation component. For example, the output of the Hall-effect sensor 106 is received as an input by the threshold adaptation electronic stage 108.

At block 208, a peak value of the received signal is stored by the adaptation component. For example, the adaptation component 108 detects or samples and holds the peak value of the received signal. At block 210, a reset pattern is detected in the received signal by the adaptation component. For example, the adaptation component 108 detects a pattern that comprises a plurality of minimum-to-maximum-to-minimum cycles of the output of the Hall-effect sensor 106 where the peak value of the output of the Hall-effect sensor 106 is further determined to be significantly less than the tracked and hold peak value stored by the adaptation component 108. This pattern is consistent with a condition where the peak of the Hall-effect sensor 106 has shifted significantly lower, and in this circumstance, the threshold coupling output of the coupling 110 ought to be reset to reflect this shifted peak level rather than waiting for the slow adaptation function to ramp this down over an extended period of time.

At block 212, the peak value stored by the adaptation component is reset in response to detection of the reset pattern by the adaptation component. For example, the adaptation component 108 resets the peak value of the output of the Hall-effect sensor 106 that it is holding and recaptures the current value and/or peak. At block 214, the stored peak value is output by the adaptation component (this may be the reset value of the stored peak). At block 216, a threshold output that is less than but proportional to the stored peak value output is generated by the adaptation component. At block 218, the threshold output is received by a switch component, for example by the switch stage 112. At block 220, the signal output is received by the Hall-effect sensor by the switch component, for example by the switch stage 112. At block 222, a logic active value is switched to output by the switch component on the event of the received signal output by the Half-effect sensor exceeding the received threshold output.

Figure 4:
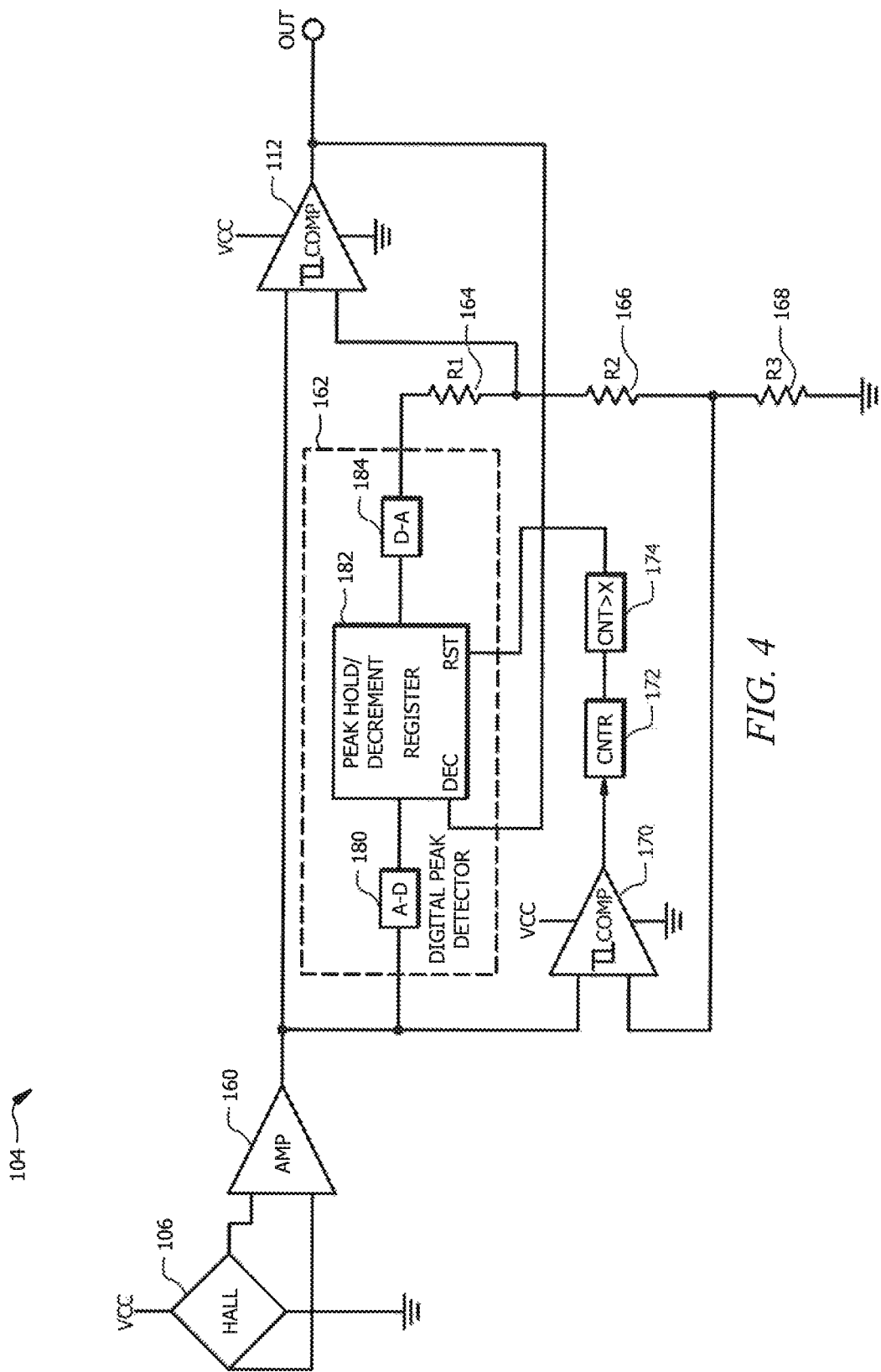
FIG. 4 is a block diagram of a Hall-sensor according to an embodiment of the disclosure.

Tuning now to FIG. 4, an illustrative embodiment of the position sensor 104 is described. It should be understood that the embodiment described with reference to FIG. 4 is one embodiment and that other embodiments of the features and advantages taught by the present disclosure are contemplated. To some extent the features of the embodiment illustrated in FIG. 4, for ease of describing and illustrating the conceptual processing of the features, use separate functional blocks that may be performed in a different implementation by integrated blocks or may be performed digitally by executing logic. The position sensor 104 comprises the Hall-effect sensor 106, an amplifier 160, and a peak and hold stage 162. A threshold coupling stage may be implemented as a series of resistors comprising a first resistor 164, a second resistor 166, and a third resistor 168. The position sensor 104 may further comprise a rapid adaptation stage comprising a first comparator 170, a counter 172, and a reset signal generation stage 174. The peak and hold stage 162 may comprise an analog-to-digital (AD) converter 180, a peak hold/decrement register 182, and a digital-to-analog (DA) converter 184.

Under normal operating conditions (e.g., the peak output value of the Hall-effect sensor 106 does not change suddenly, abruptly, and/or rapidly), the peak and hold stage 162 may capture and hold the peak value of an output of the amplifier 160. The output of the Hall-effect sensor 106 may be very low, for example, in the microvolt ($\mu V$) range, hence it may be desirable to amplify that low amplitude signal. The output of the amplifier 160 is tracked and held by the peak and hold stage 162. The output of the peak and hold stage 162 is voltage divided across the threshold coupling stage formed by the resistors 164, 166, 168. A first voltage V1 is present at the node between the first resistor 164 and the second resistor 166. This first voltage V1 may be referred to as a coupled threshold output and is provided as a comparison threshold to the switch stage 112. The output of the amplifier 160 is also provided to the switch stage 112. When the value of the output of the amplifier 160 sufficiently exceeds the coupled threshold output, the switch stage 112 switches to output an active logic level. When the value of the output of the amplifier 160 falls sufficiently below the coupled threshold output (the switch stage 112 may implement a hysteresis function), the output of the switch stage 112 switches to output an inactive logic level. In normal operations, the output of the switch stage 112 reflects the magnet 102 being close or being distant from the Hall-effect sensor 106, for example reflects when the display panel 142 of the laptop 140 is closed or when the display panel 142 of the laptop 140 is open.

Under an abnormal condition, however, the peak magnetic field amplitude sensed by the Hall-effect sensor 106 changes abruptly, for example, because the laptop 140 is dropped and the magnet 102 is moved or the mechanical shock alters the magnetic properties of the magnet 102. In case of abrupt and significant change in the peak of the output of the amplifier 160, the first comparator 170, the counter 172, and the reset signal generation stage 174 may generate a reset signal that causes the peak hold/decrement register 182 to immediately reset and capture the current output of the amplifier 160 as the current peak and track the peak output going forwards. In an embodiment, the function of the first comparator 170, the counter 172, and/or reset signal generation stage 174 may be disabled while the output of the switch stage 112 continues to transition. For example, every transition of the output of the switch stage 112 may zero the counter 172.

When allowed to operate (e.g., the switch stage 112 is not transitioning), however, the first comparator 170 may switch at the substantially lower peak output of the amplifier 160. The first comparator 170 receives a threshold signal that is the voltage V2 of the node between the second resistor 166 and the third resistor 168. One skilled in the art recognizes that the V1 voltage is higher than the V2 voltage. In an embodiment, the values of the resistors 164, 166, and 168 may be selected so the threshold coupling output provided to the switch stage 112 is about 75% of the output of the peak hold/decrement register 182 (the analog conversion of the digital output of the peak hold/decrement register 182) and the voltage V2 is about 20% of the output of the peak hold/decrement register 182. Thus, the first comparator 170 will switch in response to lowered peak values of the output of the amplifier 160. On each switch output of the first comparator 170, the counter 172 increments. As the output of the counter 172 exceeds a predefined value X, the reset signal generation stage 174 sends a reset signal to the peak hold/decrement register 182, causing it to zero its held peak value and therefore to recapture a new peak value immediately. This way the position sensor 104 can rapidly adapt to abrupt changes in peak output of the Hall-effect sensor 106. In an embodiment where the position sensor 104 is used in a laptop, a user may simply open and close the laptop 140 several times to cause the position sensor 104 to reset and capture a new peak value, in the event of an abrupt change in the interaction between the magnet 102 and the Hall-effect sensor 106.

While several embodiments have been provided in the present disclosure, it should be understood that the disclosed systems and methods may be embodied in many other specific forms without departing from the spirit or scope of the present disclosure. The present examples are to be considered as illustrative and not restrictive, and the intention is not to be limited to the details given herein. For example, the various elements or components may be combined or integrated in another system, or certain features may be omitted or not implemented.

Also, techniques, systems, subsystems, and methods described and illustrated in the various embodiments as discrete or separate may be combined or integrated with other systems, modules, techniques, or methods without departing from the scope of the present disclosure. Other items shown or discussed as directly coupled or communicating with each other may be indirectly coupled or communicating through some interface, device, or intermediate component, whether electrically, mechanically, or otherwise. Other examples of changes, substitutions, and alterations are ascertainable by one skilled in the art and could be made without departing from the spirit and scope disclosed herein.

What is claimed is:

1. A position sensor, comprising:
a Hall-effect sensor;
an adaptation electronic stage coupled to the Hall-effect sensor that outputs a comparison threshold signal based on peak detecting an output of the Hall-effect sensor using a long term adjustment and resetting the long term adjustment to a current output of the Hall-effect sensor in response to a short term adjustment, wherein the adaptation electronic stage comprises:
a rapid adaptation stage comprising:
a first comparator;
a counter operatively coupled to the first comparator; and,
a reset signal generation stage operatively coupled to the counter; and,
a peak and hold stage comprising:
a peak-and-hold and decrement register operatively coupled to the reset signal generation stage; and,
a switch electronic stage coupled to the Hall-effect sensor and to the adaptation electronic stage that switches to output a logic active value in response to the output of the Hall-effect sensor exceeding the comparison threshold output,
wherein an input of the first comparator is operatively coupled to the output of the Hall-effect sensor and an output of the peak and hold stage, such that the first comparator is configured to output a switch output signal indicative of a comparison between the output of the Hall-effect sensor and a fraction of the output of the peak and hold/decrement register,
wherein the counter is configured to increment on each transition of the switch output signal,
wherein the reset signal generation stage is configured to generate the short term adjustment to reset the peak and hold/decrement register in response to the counter exceeding a predefined value.

2. The position sensor of claim 1, wherein the position sensor is configured to detect the presence of a permanent magnet whose position is moved with reference to the position of the position sensor; wherein the long term adjustment is configured to allow the adaptation electronic stage to follow an increase in a peak value of the output of the Hall-effect sensor.

3. The position sensor of claim 2, wherein the short term adjustment is triggered by an abrupt change in the peak output of the Hall-effect sensor in response to the permanent magnet being located close to the position of the position sensor; wherein the adaptation electronic stage is configured to decrease its output over time to continue to track the peak value of the output of the Hall-effect sensor if that peak value decreases.

4. The position sensor of claim 1, wherein the switch electronic stage provides hysteresis in switching.

5. The position sensor of claim 1, wherein the adaptation electronic stage resets the long term adjustment in response to a plurality of minimum-to-peak-to-minimum cycles of the Hall-effect sensor that do not cause the switch electronic stage to output a logic active value.

6. The position sensor of claim 1, wherein the position sensor is configured for use in detecting when a laptop is closed.

7. The position sensor of claim 1, wherein the position sensor is configured for use in detecting when a cover is opened.

8. A method of determining a position of a device using a Hall-effect sensor, comprising:
receiving a magnetic input by a Hall-effect sensor;
outputting a signal by the Hall-effect sensor that represents the magnetic input;
receiving the signal output by the Hall-effect sensor by an adaptation component;
storing a peak value of the received signal by a peak-and-hold stage of the adaptation component;
outputting, by a first comparator operatively coupled to the output of the Hall-effect sensor and an output of the peak and hold stage, a switch output signal;

incrementing a counter operatively coupled to the first comparator on each transition of the switch output signal;
generating, by a reset signal generation stage operatively coupled to the counter, a reset pattern to effectuate resetting a peak-and-hold and decrement register of the peak and hold stage in response to the counter exceeding a predefined value;
detecting the reset pattern in the received signal by the adaptation component;
resetting the peak value stored by the peak-and-hold stage of the adaptation component in response to detection of the reset pattern by the peak-and-hold stage of the adaptation component;
outputting the stored peak value by the peak-and-hold stage of the adaptation component;
generating a threshold output that is less than but proportional to the stored peak value output by the peak-and-hold stage of the adaptation component;
receiving the threshold output by a switch component;
receiving the signal output by the Hall-effect sensor by the switch component; and
switching to output a logic active value by the switch component on the event of the received signal output by the Hall-effect sensor exceeding the received threshold output,
wherein the peak-and-hold and decrement register is operatively coupled to the reset signal generation stage,
wherein the switch output signal is indicative of a comparison between the output of the Hall-effect sensor and a fraction of the output of the peak and hold/decrement register.

9. The method of claim 8, where the magnetic input is received by the Hall-effect sensor from a permanent magnet whose position moves with reference to the position of the Hall-effect sensor.

10. The method of claim 8, wherein the reset pattern comprises a plurality of minimum-to-peak-to-minimum cycles of signal output by the Hall-effect sensor.

11. The method of claim 10, wherein the reset pattern further comprises that the switch component does not switch to output a logic active during the plurality of minimum-to-peak-to-minimum cycles of the signal output by the Hall-effect sensor.

12. The method of claim 8, wherein the signal output by the Hall-effect sensor is conditioned by an amplifier before it is provided to the adaptation component and to the switch component.

13. The method of claim 8, wherein the switch component is a comparator.

14. The method of claim 13, wherein the comparator is a hysteresis comparator.

15. An electronic device comprising:
a permanent magnet mechanically coupled to a first portion of the electronic device;
a Hall-effect sensor coupled to a second portion of the electronic device where the first portion and the second portion are moveable with reference to each other and where the Hall-effect sensor receives a magnetic field of the permanent magnet in at least some working configurations of the electronic device;
an adaptation electronic stage coupled to the Hall-effect sensor that outputs a comparison threshold signal based on peak detecting an output of the Hall-effect sensor using a long term adjustment and resetting the long term adjustment to a current output of the Hall-effect sensor in response to a short term adjustment, wherein the adaptation electronic stage comprises:
a rapid adaptation stage comprising:
a first comparator;
a counter operatively coupled to the first comparator; and,
a reset signal generation stage operatively coupled to the counter; and,
a peak and hold stage comprising:
a peak-and-hold and decrement register operatively coupled to the reset signal generation stage; and,
a switch electronic stage coupled to the Hall-effect sensor and to the adaptation electronic stage that switches to output a logic active value in response to the output of the Hall-effect sensor exceeding the comparison threshold output,
wherein an input of the first comparator is operatively coupled to the output of the Hall-effect sensor and an output of the peak and hold stage, such that the first comparator is configured to output a switch output signal indicative of a comparison between the output of the Hall-effect sensor and a fraction of the output of the peak and hold/decrement register,
wherein the counter is configured to increment on each transition of the switch output signal,
wherein the reset signal generation stage is configured to generate the short term adjustment to reset the peak and hold/decrement register in response to the counter exceeding a predefined value.

16. The electronic device of claim 15, wherein the electronic device is a laptop computer.

17. The electronic device of claim 15, wherein the electronic device is a battery compartment cover.

18. The electronic device of claim 15, wherein the short term adjustment is triggered by an abrupt change in the peak output of the Hall-effect sensor in response to the permanent magnet being located close to the position of the position sensor.

19. The electronic device of claim 15, wherein the switch electronic stage provides hysteresis in switching.

20. The electronic device of claim 15, wherein the adaptation electronic stage resets the long term adjustment in response to a plurality of minimum-to-peak-to-minimum cycles of the Hall-effect sensor that do not cause the switch electronic stage to output a logic active value.

* * * * *